United States Patent
Zhang et al.

(10) Patent No.: US 11,610,550 B2
(45) Date of Patent: Mar. 21, 2023

(54) GATE DRIVING CIRCUIT AND DISPLAY DEVICE COMPRISING THE SAME

(71) Applicant: Shenzhen China Star Optoelectronics Semiconductor Display Technology Co., Ltd., Shenzhen (CN)

(72) Inventors: Liuqi Zhang, Shenzhen (CN); Baixiang Han, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/757,408

(22) PCT Filed: Mar. 19, 2020

(86) PCT No.: PCT/CN2020/080110
§ 371 (c)(1),
(2) Date: Apr. 19, 2020

(87) PCT Pub. No.: WO2021/159583
PCT Pub. Date: Aug. 19, 2021

(65) Prior Publication Data
US 2022/0375410 A1    Nov. 24, 2022

(30) Foreign Application Priority Data
Feb. 11, 2020 (CN) .......................... 202010087217.6

(51) Int. Cl.
G09G 3/3266 (2016.01)
G09G 3/3225 (2016.01)

(52) U.S. Cl.
CPC ... *G09G 3/3266* (2013.01); *G09G 2300/0426* (2013.01); *G09G 2300/0819* (2013.01); *G09G 2300/0852* (2013.01); *G09G 2310/061* (2013.01); *G09G 2310/08* (2013.01); *G09G 2320/0233* (2013.01); *G09G 2330/02* (2013.01)

(58) Field of Classification Search
CPC .......................... G09G 3/3266; G09G 3/367
See application file for complete search history.

(56) References Cited

U.S. PATENT DOCUMENTS 9,054,203 B2 * 6/2015 Miyairi ............... H01L 27/1225
11,114,037 B1 * 9/2021 Zhang ................... G09G 3/3266
(Continued)

FOREIGN PATENT DOCUMENTS

CN      102034553 A    4/2011
CN      102097132 A    6/2011
(Continued)

*Primary Examiner* — Sepehr Azari
(74) *Attorney, Agent, or Firm* — PV IP PC; Wei Te Chung; Ude Lu

(57) ABSTRACT

A gate driving unit includes an input module, a first output module, a second output module, a feedback module, and an output-controlling module. The input module outputs a previous level-transferring signal into a first node. The first output module outputs a present level-transferring signal. The second output module outputs a scan signal. The feedback module outputs a present-level feedback signal. The output-controlling module pulls up potential of the scan signal to a first direct-current high voltage and pulls up potential of the present level-transferring signal to a second direct-current high voltage.

14 Claims, 3 Drawing Sheets

(56) References Cited

U.S. PATENT DOCUMENTS

| | | | |
|---|---|---|---|
| 11,127,339 B2* | 9/2021 | Kim | G09G 3/2092 |
| 2007/0188436 A1* | 8/2007 | Wei | G11C 19/00 345/100 |
| 2008/0048712 A1* | 2/2008 | Ahn | H03K 17/161 326/21 |
| 2011/0141075 A1 | 6/2011 | Chiang | |
| 2014/0362067 A1* | 12/2014 | Wang | G11C 19/28 345/94 |
| 2015/0029082 A1* | 1/2015 | Jeon | G09G 3/3677 377/64 |
| 2015/0228240 A1* | 8/2015 | Ahn | G09G 3/20 345/99 |
| 2015/0317954 A1* | 11/2015 | Jang | G09G 3/3677 345/82 |
| 2017/0004796 A1* | 1/2017 | Zhao | G11C 19/287 |
| 2017/0018245 A1* | 1/2017 | Park | G09G 3/3677 |
| 2018/0211627 A1* | 7/2018 | Shi | G09G 3/3677 |
| 2019/0266934 A1* | 8/2019 | Seong | G09G 3/20 |
| 2020/0035179 A1* | 1/2020 | Chen | G09G 3/3648 |
| 2021/0407356 A1* | 12/2021 | Xue | G09G 3/20 |
| 2022/0199034 A1* | 6/2022 | Yun | G09G 3/3266 |

FOREIGN PATENT DOCUMENTS

| | | |
|---|---|---|
| CN | 202736497 U | 2/2013 |
| CN | 103617784 A | 3/2014 |
| CN | 104575396 A | 4/2015 |
| CN | 109192167 A | 1/2019 |
| CN | 109243371 A | 1/2019 |
| CN | 109243372 A | 1/2019 |
| CN | 110047438 A | 7/2019 |
| CN | 110070828 A | 7/2019 |
| CN | 110085160 A | 8/2019 |
| CN | 110136653 A | 8/2019 |
| CN | 110349536 A | 10/2019 |
| CN | 110379349 A | 10/2019 |
| KR | 20170010283 A | 1/2017 |

* cited by examiner

GATE DRIVING CIRCUIT AND DISPLAY DEVICE COMPRISING THE SAME

BACKGROUND OF DISCLOSURE

1. Field of Disclosure

The present disclosure relates to the field of display technology, and more particularly, to a gate driving circuit configured for a display panel.

2. Description of Related Art

Due to high mobility, indium gallium zinc oxide (IGZO) is widely applied in large-size active-matrix organic light-emitting diode (AMOLED) display devices. However, because IGZO lacks stability, AMOLED display devices must utilize a compensating circuit in order to guarantee uniformity of brightness of display devices.

In general, the compensating circuit needs a positive impulse waveform and a negative impulse waveform. However, a conventional gate driving circuit generating the negative impulse waveform still lacks stability.

SUMMARY

A technical problem is that a conventional gate driving circuit generating the negative impulse waveform still lacks stability.

The object of the present disclosure is to provide a gate driving circuit and a display device to improve stability of negative impulse circuits.

In order to realize the above object, the present disclosure provides a gate driving circuit, including a plurality of gate driving units cascaded, wherein each of the gate driving units includes: an input module including a first transistor, wherein a gate electrode of the first transistor is connected to a clock signal, a source electrode of the first transistor is connected to a previous level-transferring signal, and a drain electrode of the first transistor is connected to a first node, and wherein the input module is configured to output the previous level-transferring signal into the first node under control of the clock signal; a first output module connected to the clock signal and a second node and configured to output a present level-transferring signal under control of potential of the second node; a second output module connected to the clock signal and a second node and configured to output a scan signal under control of potential of the second node; a feedback module connected to the clock signal, a second node, and a first direct-current high voltage and configured to output a present-level feedback signal under control of potential of the second node; an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage; an inverter module connected to the first node, the second node, a direct-current low voltage, and the first direct-current high voltage and configured to control the potential of the second node under control of the potential of the first node; and a maintaining module connected to the first node, the second node, and the direct-current low voltage and configured to maintain the potential of the first node at the direct-current low voltage under control of the potential of the second node.

In order to realize the above object, the present disclosure further provides a gate driving circuit, including a plurality of gate driving units cascaded, wherein each of the gate driving units includes: an input module connected to a clock signal, a previous level-transferring signal, and a first node and configured to output the previous level-transferring signal into the first node under control of the clock signal; a first output module connected to the clock signal and a second node and configured to output a present level-transferring signal under control of potential of the second node; a second output module connected to the clock signal and a second node and configured to output a scan signal under control of potential of the second node; a feedback module connected to the clock signal, a second node, and a first direct-current high voltage and configured to output a present-level feedback signal under control of potential of the second node; and an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage.

In some embodiments, each of the gate driving units further includes: an inverter module connected to the first node, the second node, a direct-current low voltage, and the first direct-current high voltage and configured to control the potential of the second node under control of the potential of the first node; and a maintaining module connected to the first node, the second node, and the direct-current low voltage and configured to maintain the potential of the first node at the direct-current low voltage under control of the potential of the second node.

In some embodiments, the input module includes a first transistor, wherein a gate electrode of the first transistor is connected to the clock signal, a source electrode of the first transistor is connected to the previous level-transferring signal, and a drain electrode of the first transistor is connected to the first node.

In some embodiments, the inverter module includes: a second transistor, wherein a gate electrode of the second transistor is connected to the first node, and a source electrode of the second transistor is connected to the direct-current low voltage; a third transistor, wherein a gate electrode of the third transistor is connected to the first node, a source electrode of the third transistor is connected to the direct-current low voltage, and a drain electrode of the third transistor is connected to the second node; a fourth transistor, wherein a gate electrode and a source electrode of the fourth transistor are connected to the first direct-current high voltage, and a drain electrode of the fourth transistor is connected to a drain electrode of the second transistor; and a fifth transistor, wherein a gate electrode of the fifth transistor is connected to the drain electrode of the second transistor, a source electrode of the fifth transistor is connected to the first direct-current high voltage, and a drain electrode of the fifth transistor is connected to the second node.

In some embodiments, the maintaining module includes a sixth transistor, wherein a gate electrode of the sixth transistor is connected to the second node, a source electrode of the sixth transistor is connected to the direct-current low voltage, and a drain electrode of the sixth transistor is connected to the first node.

In some embodiments, the first output module includes a seventh transistor, wherein a gate electrode of the seventh transistor is connected to the second node, a source electrode of the seventh transistor is connected to the clock signal, and a drain electrode of the seventh transistor is connected to the present level-transferring signal.

In some embodiments, the second output module includes an eighth transistor, wherein a gate electrode of the eighth transistor is connected to the second node, a source electrode of the eighth transistor is connected to the clock signal, and a drain electrode of the eighth transistor is connected to the scan signal.

In some embodiments, the output-controlling module includes: a ninth transistor, wherein a gate electrode of the ninth transistor is connected to the first node, a source electrode of the ninth transistor is connected to the second direct-current high voltage, and a drain electrode of the ninth transistor is connected to the present level-transferring signal; and a tenth transistor, wherein a gate electrode of the tenth transistor is connected to the first node, a source electrode of the tenth transistor is connected to the first direct-current high voltage, and a drain electrode of the tenth transistor is connected to the scan signal.

In some embodiments, the feedback module includes: an eleventh transistor, wherein a gate electrode of the eleventh transistor is connected to the second node, a source electrode of the eleventh transistor is connected to the clock signal, and a drain electrode of the eleventh transistor is connected to the present-level feedback signal; and a twelfth transistor, wherein a gate electrode of the twelfth transistor is connected to the first node, a source electrode of the twelfth transistor is connected to the first direct-current high voltage, and a drain electrode of the twelfth transistor is connected to the present-level feedback signal.

In some embodiments, each of the gate driving units further includes a first capacitor, wherein the gate electrode of the ninth transistor and the gate electrode of the tenth transistor are connected to the next-level feedback signal through the first capacitor.

In some embodiments, each of the gate driving units further includes a thirteenth transistor, wherein a gate electrode and a source electrode of the thirteenth transistor are connected to a restoration signal, and a drain electrode of the thirteenth transistor is connected to the first node.

In order to realize the above object, the present disclosure further provides a display device, including a gate driving circuit, the gate driving circuit including a plurality of gate driving units cascaded, wherein each of the gate driving units includes: an input module connected to a clock signal, a previous level-transferring signal, and a first node and configured to output the previous level-transferring signal into the first node under control of the clock signal; a first output module connected to the clock signal and a second node and configured to output a present level-transferring signal under control of potential of the second node; a second output module connected to the clock signal and a second node and configured to output a scan signal under control of potential of the second node; a feedback module connected to the clock signal, a second node, and a first direct-current high voltage and configured to output a present-level feedback signal under control of potential of the second node; and an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage.

The beneficial effect of the present disclosure is that a gate driving circuit and a display device are provided to improve stability of negative impulse circuits.

BRIEF DESCRIPTION OF DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DETAILED DESCRIPTION OF EMBODIMENTS

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and not used to limit the disclosure.

Figure 1:
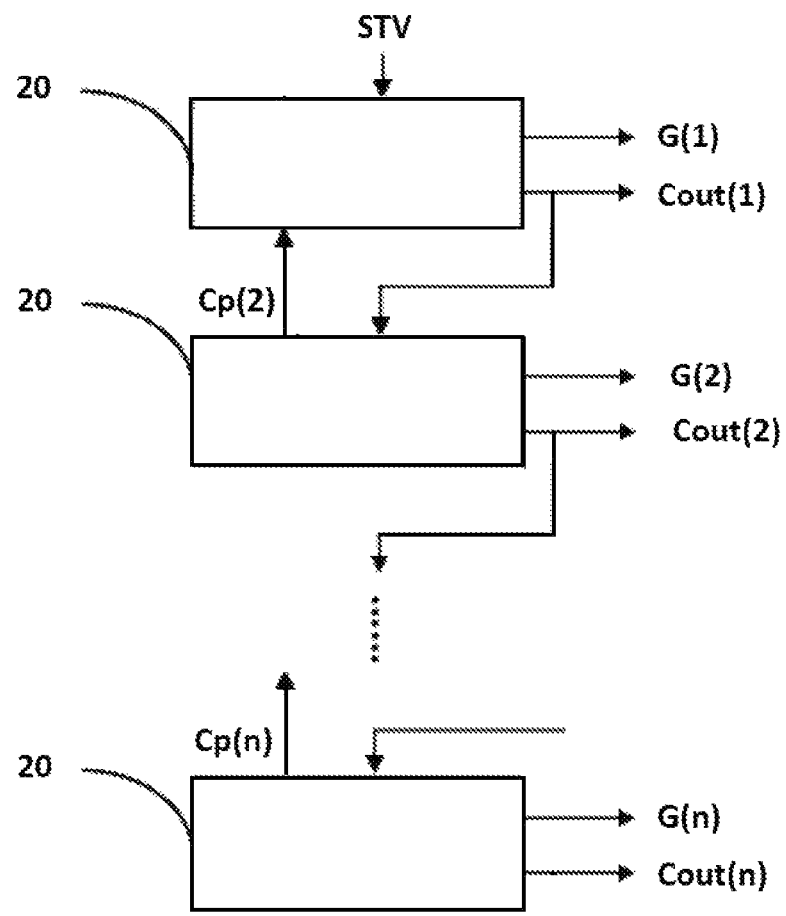
FIG. 1 is a functional block diagram of a gate driving circuit of a display device according to one embodiment of the present disclosure.

Please refer to FIG. 1, which is a functional block diagram of a gate driving circuit of a display device according to one embodiment of the present disclosure. In the present embodiment, the display device at least includes a gate driving circuit 1. The gate driving circuit 1 includes a plurality of gate driving units 20 cascaded. Each of the gate driving units 20 is configured to output a scan signal G(n) and a level-transferring signal Cout(n), which are of negative impulse waveforms. When the gate driving circuit 1 operates, a first gate driving unit 20 is driven by a starting signal STV. Then, the rest of the gate driving units 20 are sequentially driven by a level-transferring signal Cout(n) from a previous gate driving unit 20.

Figure 2:
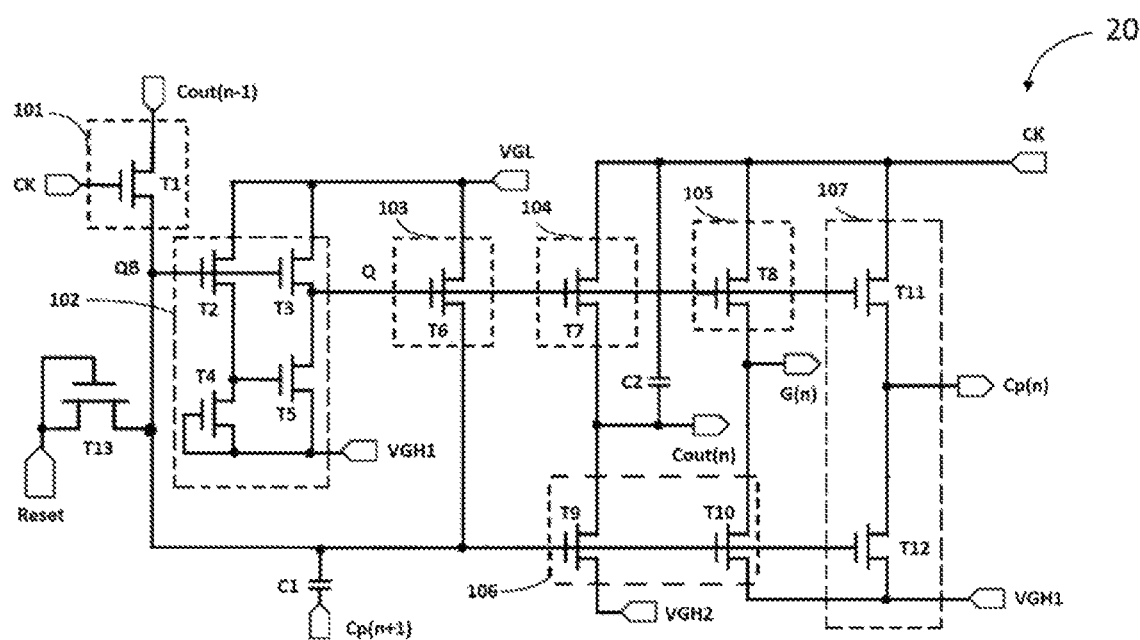
FIG. 2 is a schematic circuit diagram of a gate driving unit as shown in FIG. 1.

Please refer to FIG. 2, which is a schematic circuit diagram of a gate driving unit as shown in FIG. 1. Each of the gate driving units 20 includes an input module 101, an inverter module 102, a maintaining module 103, a first output module 104, a second output module 105, an output-controlling module 106, and a feedback module 107. In the present embodiment, each of the gate driving units 20 is the n-th level of gate driving unit, wherein n is a positive integer.

As shown in FIG. 2, the input module 101 is connected to a clock signal CK, a previous level-transferring signal Cout(n−1), and a first node QB. The input module 101 is configured to output the previous level-transferring signal Cout(n−1) into the first node QB under control of the clock signal CK. The input module 101 includes a first transistor T1, wherein a gate electrode of the first transistor T1 is connected to the clock signal CK, a source electrode of the first transistor T1 is connected to the previous level-transferring signal Cout(n−1), and a drain electrode of the first transistor T1 is connected to the first node QB.

As shown in FIG. 2, the inverter module 102 is connected to the first node QB, a second node Q, a direct-current low voltage VGL, and a first direct-current high voltage VGH1. The inverter module 102 is configured to control potential of the second node Q under control of potential of the first node QB. The inverter module 102 includes a second transistor T2, a third transistor T3, a fourth transistor T4, and a fifth transistor T5. A gate electrode of the second transistor T2 is connected to the first node QB, and a source electrode of the second transistor T2 is connected to the direct-current low voltage VGL. A gate electrode of the third transistor T3 is connected to the first node QB, a source electrode of the third transistor T3 is connected to the direct-current low voltage VGL, and a drain electrode of the third transistor T3 is connected to the second node Q. A gate electrode and a source electrode of the fourth transistor T4 are connected to the first direct-current high voltage VGH1, and a drain electrode of the fourth transistor T4 is connected to a drain electrode of the second transistor T2. A gate electrode of the fifth transistor T5 is connected to the drain electrode of the second transistor T2, a source electrode of the fifth transistor T5 is connected to the first direct-current high voltage VGH1, and a drain electrode of the fifth transistor T5 is connected to the second node Q.

As shown in FIG. 2, the maintaining module 103 is connected to the first node QB, the second node Q, and the direct-current low voltage VGL. The maintaining module 103 is configured to maintain the potential of the first node QB at the direct-current low voltage VGL under control of the potential of the second node Q. The maintaining module 103 includes a sixth transistor T6, wherein a gate electrode of the sixth transistor T6 is connected to the second node Q, a source electrode of the sixth transistor T6 is connected to the direct-current low voltage VGL, and a drain electrode of the sixth transistor T6 is connected to the first node QB.

As shown in FIG. 2, the first output module 104 is connected to the clock signal CK and the second node Q. The first output module 104 is configured to output a present level-transferring signal Cout(n) under control of the potential of the second node Q. The first output module 104 includes a seventh transistor T7, wherein a gate electrode of the seventh transistor T7 is connected to the second node Q, a source electrode of the seventh transistor T7 is connected to the clock signal CK, and a drain electrode of the seventh transistor T7 is connected to the present level-transferring signal Cout(n).

As shown in FIG. 2, the second output module 105 is connected to the clock signal CK and the second node Q. The second output module 105 is configured to output the scan signal G(n) under control of the potential of the second node Q. The second output module 105 includes an eighth transistor T8, wherein a gate electrode of the eighth transistor T8 is connected to the second node Q, a source electrode of the eighth transistor T8 is connected to the clock signal CK, and a drain electrode of the eighth transistor T8 is connected to the scan signal G(n).

As shown in FIG. 2, the output-controlling module 106 is connected to a next-level feedback signal Cp(n+1), the first direct-current high voltage VGH1, a second direct-current high voltage VGH2, the first node QB, the first output module 104, and the second output module 105. The output-controlling module 106 is configured to, under control of potential of the first node QB and the next-level feedback signal Cp(n+1), pull up potential of the scan signal G(n) to the first direct-current high voltage VGH1 and pull up potential of the present level-transferring signal Cout(n) to the second direct-current high voltage VGH2. The output-controlling module 106 includes a ninth transistor T9 and a tenth transistor T10. A gate electrode of the ninth transistor T9 is connected to the first node QB, a source electrode of the ninth transistor T9 is connected to the second direct-current high voltage VGH2, and a drain electrode of the ninth transistor T9 is connected to the present level-transferring signal Cout(n). A gate electrode of the tenth transistor T10 is connected to the first node QB, a source electrode of the tenth transistor T10 is connected to the first direct-current high voltage VGH1, and a drain electrode of the tenth transistor T10 is connected to the scan signal G(n).

As shown in FIG. 2, the feedback module 107 is connected to the clock signal CK, the second node Q, and the first direct-current high voltage VGH1. The feedback module 107 is configured to output a present-level feedback signal Cp(n) under control of the potential of the second node Q. The feedback module 107 includes an eleventh transistor T11 and a twelfth transistor T12. A gate electrode of the eleventh transistor T11 is connected to the second node Q, a source electrode of the eleventh transistor T11 is connected to the clock signal CK, and a drain electrode of the eleventh transistor T11 is connected to the present-level feedback signal Cp(n). A gate electrode of the twelfth transistor T12 is connected to the first node QB, a source electrode of the twelfth transistor T12 is connected to the first direct-current high voltage VGH1, and a drain electrode of the twelfth transistor T12 is connected to the present-level feedback signal Cp(n).

As shown in FIG. 2, each of the gate driving units 20 further includes a first capacitor C1 and a thirteenth transistor T13. The gate electrode of the ninth transistor T9 and the gate electrode of the tenth transistor T10 are connected to the next-level feedback signal Cp(n+1) through the first capacitor C1. A gate electrode and a source electrode of the thirteenth transistor T13 are connected to a restoration signal Reset, and a drain electrode of the thirteenth transistor T13 is connected to the first node QB.

Figure 3:
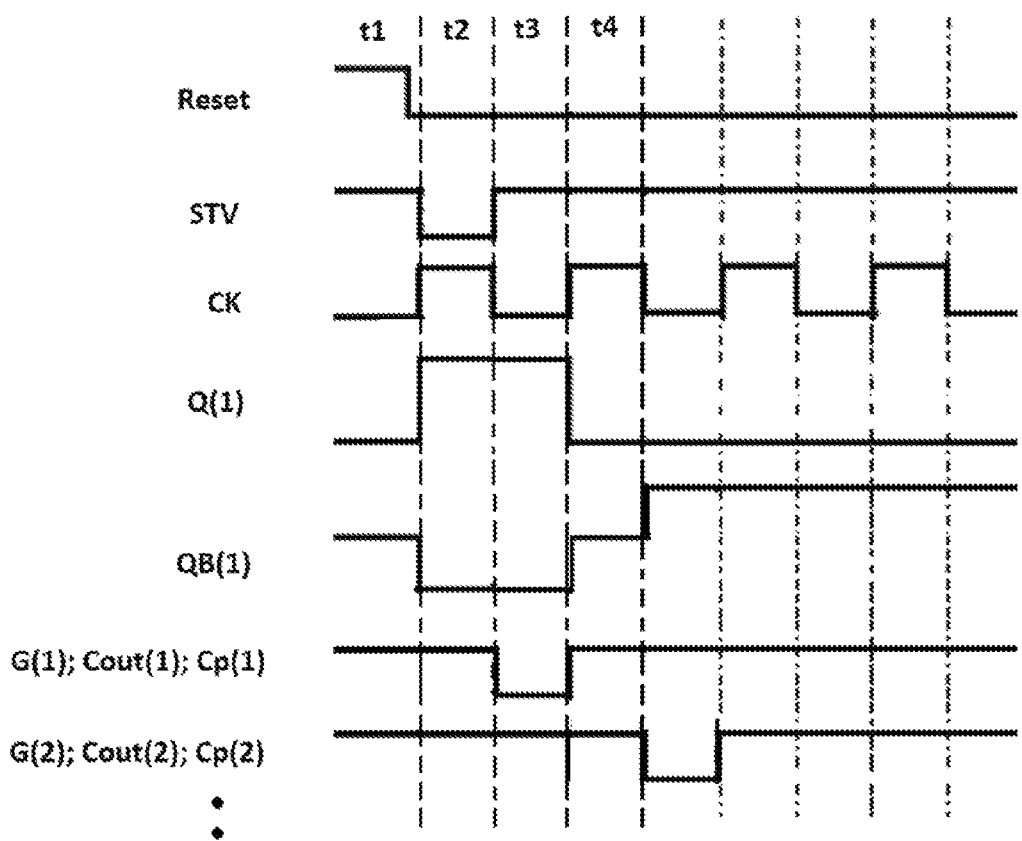
FIG. 3 is a timing diagram of a gate driving unit as shown in FIG. 2.

Please refer to FIG. 3, which is a timing diagram of a gate driving unit as shown in FIG. 2. When a present gate driving unit 20 enters into a stage t1, a high potential is outputted into the first nodes QB of all of the gate driving units 20 through the restoration signal Reset.

When the present gate driving unit 20 enters into a stage t2, the starting signal STV outputs a low potential into a first node QB(1) through the first transistor T1, the second transistor T2, the third transistor T3, the ninth transistor T9, the tenth transistor T10, and the twelfth transistor T12 turn off, potential of a second node Q(1) is pulled up to a high potential through the inverter module 102 and the first direct-current high voltage VGH1, the sixth transistor T6, the seventh transistor T7, and the eighth transistor T8, and the eleventh transistor T11 turn on, and the clock signal CK maintains potential of a scan signal G(1) and a present level-transferring signal Cout(1) at a high potential.

When the present gate driving unit 20 enters into a stage t3, potential of the clock signal CK changes from high to low, the first transistor T1 turns off, potential of the first node QB(1) keeps low through the sixth transistor T6 and the direct-current low voltage VGL, the potential of the second node Q(1) keeps high, and the clock signal CK respectively outputs a negative impulse waveform into the present level-transferring signal Cout(1), the scan signal G(1), and the present-level feedback signal Cp(1) through the seventh transistor T7, the eighth transistor T8, and the eleventh transistor T11.

When a next-level gate driving unit 20 enters into a stage t4, the potential of the clock signal CK changes from low to high, the first transistor T1 turns on, the previous level-transferring signal Cout(1) pulls up potential of a first node QB(2) to a high potential, the second transistor T2, the third transistor T3, the ninth transistor T9, the tenth transistor T10, and the twelfth transistor T12 turn on, the direct-current low voltage VGL pulls down potential of a second node Q(2) to a low potential, and the first direct-current high voltage VGH1 and the second direct-current high voltage VGH2 pull up potential of a present level-transferring signal Cout (2), a scan signal G(2), and a present-level feedback signal Cp(2) to a high potential; meanwhile, the potential of the first node QB(1) is coupled to a higher potential through the present-level feedback signal Cp(2) and the first capacitor C1.

In conclusion, because the present level-transferring signal Cout(n) and the present-level feedback signal Cp(n) are separated, stability of the present level-transferring signal Cout(n) is improved. Thus, it is ensured that a gate driving unit causes potential of a first node QB to keep high within a greater threshold voltage margin, so that stability of a gate driving circuit is improved.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that a gate driving unit is ensured to cause potential of a first node QB to keep high within a greater threshold voltage margin, so that stability of a gate driving circuit is improved.

What is claimed is:

1. A gate driving circuit, comprising a plurality of gate driving units cascaded, wherein each of the gate driving units comprises:
    an input module comprising a first transistor, wherein a gate electrode of the first transistor is connected to a clock signal, a source electrode of the first transistor is connected to a previous level-transferring signal, and a drain electrode of the first transistor is connected to a first node, and wherein the input module is configured to output the previous level-transferring signal into the first node under control of the clock signal;
    a first output module connected to the clock signal and a second node and configured to output a present level-transferring signal under control of potential of the second node;
    a second output module connected to the clock signal and the second node and configured to output a scan signal under control of the potential of the second node;
    a feedback module connected to the clock signal, the second node, and a first direct-current high voltage and configured to output a present-level feedback signal under control of the potential of the second node;
    an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage;
    an inverter module connected to the first node, the second node, a direct-current low voltage, and the first direct-current high voltage and configured to control the potential of the second node under control of the potential of the first node; and
    a maintaining module connected to the first node, the second node, and the direct-current low voltage and configured to maintain the potential of the first node at the direct-current low voltage under control of the potential of the second node.

2. A gate driving circuit, comprising a plurality of gate driving units cascaded, wherein each of the gate driving units comprises:
    an input module connected to a clock signal, a previous level-transferring signal, and a first node and configured to output the previous level-transferring signal into the first node under control of the clock signal;
    a first output module connected to the clock signal and a second node and configured to output a present level-transferring signal under control of potential of the second node;
    a second output module connected to the clock signal and a second node and configured to output a scan signal under control of the potential of the second node;
    a feedback module connected to the clock signal, a second node, and a first direct-current high voltage and configured to output a present-level feedback signal under control of the potential of the second node; and
    an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage.

3. The gate driving circuit of claim 2, wherein the each of the gate driving units further comprises:
    an inverter module connected to the first node, the second node, a direct-current low voltage, and the first direct-current high voltage and configured to control the potential of the second node under control of the potential of the first node; and
    a maintaining module connected to the first node, the second node, and the direct-current low voltage and configured to maintain the potential of the first node at the direct-current low voltage under control of the potential of the second node.

4. The gate driving circuit of claim 3, wherein the inverter module comprises:
    a second transistor, wherein a gate electrode of the second transistor is connected to the first node, and a source electrode of the second transistor is connected to the direct-current low voltage;
    a third transistor, wherein a gate electrode of the third transistor is connected to the first node, a source electrode of the third transistor is connected to the direct-current low voltage, and a drain electrode of the third transistor is connected to the second node;
    a fourth transistor, wherein a gate electrode and a source electrode of the fourth transistor are connected to the first direct-current high voltage, and a drain electrode of the fourth transistor is connected to a drain electrode of the second transistor; and a fifth transistor, wherein a gate electrode of the fifth transistor is connected to the drain electrode of the second transistor, a source electrode of the fifth transistor is connected to the first direct-current high voltage, and a drain electrode of the fifth transistor is connected to the second node.

5. The gate driving circuit of claim 3, wherein the maintaining module comprises a sixth transistor, and wherein a gate electrode of the sixth transistor is connected to the second node, a source electrode of the sixth transistor is connected to the direct-current low voltage, and a drain electrode of the sixth transistor is connected to the first node.

6. The gate driving circuit of claim 2, wherein the input module comprises a first transistor, and wherein a gate electrode of the first transistor is connected to the clock signal, a source electrode of the first transistor is connected to the previous level-transferring signal, and a drain electrode of the first transistor is connected to the first node.

7. The gate driving circuit of claim 2, wherein the first output module comprises a seventh transistor, and wherein a gate electrode of the seventh transistor is connected to the second node, a source electrode of the seventh transistor is connected to the clock signal, and a drain electrode of the seventh transistor is connected to the present level-transferring signal.

8. The gate driving circuit of claim 2, wherein the second output module comprises an eighth transistor, and wherein a gate electrode of the eighth transistor is connected to the second node, a source electrode of the eighth transistor is connected to the clock signal, and a drain electrode of the eighth transistor is connected to the scan signal.

9. The gate driving circuit of claim 2, wherein the output-controlling module comprises:
   a ninth transistor, wherein a gate electrode of the ninth transistor is connected to the first node, a source electrode of the ninth transistor is connected to the second direct-current high voltage, and a drain electrode of the ninth transistor is connected to the present level-transferring signal; and
   a tenth transistor, wherein a gate electrode of the tenth transistor is connected to the first node, a source electrode of the tenth transistor is connected to the first direct-current high voltage, and a drain electrode of the tenth transistor is connected to the scan signal.

10. The gate driving circuit of claim 9, wherein the each of the gate driving units further comprises a first capacitor, and wherein the gate electrode of the ninth transistor and the gate electrode of the tenth transistor are connected to the next-level feedback signal through the first capacitor.

11. The gate driving circuit of claim 2, wherein the feedback module comprises:
   an eleventh transistor, wherein a gate electrode of the eleventh transistor is connected to the second node, a source electrode of the eleventh transistor is connected to the clock signal, and a drain electrode of the eleventh transistor is connected to the present-level feedback signal; and
   a twelfth transistor, wherein a gate electrode of the twelfth transistor is connected to the first node, a source electrode of the twelfth transistor is connected to the first direct-current high voltage, and a drain electrode of the twelfth transistor is connected to the present-level feedback signal.

12. The gate driving circuit of claim 2, wherein the each of the gate driving units further comprises a thirteenth transistor, and wherein a gate electrode and a source electrode of the thirteenth transistor are connected to a restoration signal, and a drain electrode of the thirteenth transistor is connected to the first node.

13. A display device, comprising a gate driving circuit, the gate driving circuit comprising a plurality of gate driving units cascaded, wherein each of the gate driving units comprises:
   an input module connected to a clock signal, a previous level-transferring signal, and a first node and configured to output the previous level-transferring signal into the first node under control of the clock signal;
   a first output module connected to the clock signal and a second node and configured to output a present level-transferring signal under control of potential of the second node;
   a second output module connected to the clock signal and a second node and configured to output a scan signal under control of the potential of the second node;
   a feedback module connected to the clock signal, a second node, and a first direct-current high voltage and configured to output a present-level feedback signal under control of the potential of the second node; and
   an output-controlling module connected to a next-level feedback signal, the first direct-current high voltage, a second direct-current high voltage, the first node, the first output module, and the second output module and configured to, under control of potential of the first node and the next-level feedback signal, pull up potential of the scan signal to the first direct-current high voltage and pull up potential of the present level-transferring signal to the second direct-current high voltage.

14. The display device of claim 13, wherein the each of the gate driving units further comprises:
   an inverter module connected to the first node, the second node, a direct-current low voltage, and the first direct-current high voltage and configured to control the potential of the second node under control of the potential of the first node; and
   a maintaining module connected to the first node, the second node, and the direct-current low voltage and configured to maintain the potential of the first node at the direct-current low voltage under control of the potential of the second node.

* * * * *